United States Patent [19]
Otsubo et al.

[11] Patent Number: 5,275,977
[45] Date of Patent: Jan. 4, 1994

[54] INSULATING FILM FORMING METHOD FOR SEMICONDUCTOR DEVICE INTERCONNECTION

[75] Inventors: Toru Otsubo, Fujisawa; Yasuhiro Yamaguchi, Chigasaki, both of Japan

[73] Assignee: Hitachi, Ltd., Tokyo, Japan

[21] Appl. No.: 669,526

[22] Filed: Mar. 14, 1991

[30] Foreign Application Priority Data

Mar. 19, 1990 [JP] Japan ................... 2-67002

[51] Int. Cl.⁵ ............... H01L 21/00; H01L 21/02; H01L 21/302; H01L 21/463
[52] U.S. Cl. ................... 437/235; 437/225; 437/228; 156/643; 156/646
[58] Field of Search ......... 437/225, 228, 235; 156/643, 646

[56] References Cited

U.S. PATENT DOCUMENTS 4,617,087 10/1986 Iyer et al. .................. 156/643

OTHER PUBLICATIONS

Denki Kagaku (published by Electrochemical Society of Japan) vol. 57, No. 4 (1989), pp. 281–285.
Semicon News 1989, Jun., pp. 49–67.
Semiconductor World, 1989, Nov., pp. 78–83.
"Very Large Scale Integration Process Data Handbook", 1990, Mar., (published from K. K. Science Forum), pp. 351–356.
"Symposium on CVD Techniques for Very Large Scale Integration", 1988, Mar., pp. 26–30.

*Primary Examiner*—Brian E. Hearn
*Assistant Examiner*—B. Everhart
*Attorney, Agent, or Firm*—Fay, Sharpe, Beall, Fagan, Minnich & McKee

[57] ABSTRACT

Disclosed herein are an insulating film forming method for semiconductor device interconnection and a plasma treatment system for use in the method. The method comprises (i) a step of forming an insulating film free of void, on a substrate having an interconnection pattern, in which a mixed gas of a film forming source gas and an etching gas comprising a fluorine compound is used to perform both deposition of an insulating film by plasma CVD and reactive etching of the insulating film, simultaneously, and (ii) a step of planarizing the surface of the insulating film formed by the step (i) and comprised of, for example, silicon oxide, in which a gas of a material decomposable by a reactive gas capable of decomposing the insulating film is supplied onto the substrate so as to deposit a solid film of the material, e.g. $Si(OCH_3)_4$, on the insulating film on the substrate, the temperature of the substrate is then raised to liquefy the deposited material film, thereby planarizing the surface of the material film, the substrate temperature is again lowered to solidify the planarized liquid material film, and thereafter the insulating film together with the $Si(OCH_3)_4$ solid film is subjected to plasma etching with, for instance, $CF_4$ gas as an etching gas. According to the invention, an insulating film which is planar and free of voids can be formed on an interconnection pattern of a substrate, without affecting the characteristics of devices provided on the substrate.

14 Claims, 5 Drawing Sheets

INSULATING FILM FORMING METHOD FOR SEMICONDUCTOR DEVICE INTERCONNECTION

BACKGROUND OF THE INVENTION

This invention relates to the manufacture of semiconductor devices, and more particularly to an insulating film forming method for semiconductor device interconnection which is suitable for manufacture of highly integrated devices of multilevel interconnection structure, and to an apparatus for carrying out the method.

With the recent trend toward semiconductor devices of higher integration and higher density, the roughness of surface shape of the semiconductor devices has become greater, and reliable formation of a number of layers for interconnection on such a surface has come to be required. It is therefore necessary to form an insulating film for insulating the interconnection layers from each other, independently of the rough shape of the underlying surface and in such a manner that the insulating film will have a planar surface. For planarization of the insulating film, the methods under investigation at present are disclosed in Denki Kagaku (published by the Electrochemical Society of Japan) Vol. 57, No. 4 (1989), pp. 281-285, and Semicon NEWS 1989, June, pp. 49-67.

Many planarization methods which employ sputter-etching, etchback, reflow or the like have been proposed and studied.

For the formation of insulating films between interconnections for a semiconductor device, it is necessary not only to form a planar film but also to avoid influences of the film forming process on the device characteristics, to prevent the formation of voids in the film, to suppress dust generation attendant on the process, and so on. For higher productivity, in addition, the film forming process should not involve a wet treatment, such as use of a coating film, and should enable continuous processing in vacuum.

The above-mentioned prior arts have the following drawbacks. The method which uses sputter-etching and enables continuous processing in vacuum has the problems of influencing the device characteristics and generating dust. The methods using a coating film or etching are disadvantageous in that they use a combination of a wet process and a vacuum process. None of the conventional insulating film forming methods for semiconductor device interconnection satisfies the above-mentioned performance requirements for mass-production.

A general description of the conventional insulating film formation techniques is found, for example, in Semiconductor World, 1989, November, pp. 78-83.

SUMMARY OF THE INVENTION

It is an object of this invention to provide an insulating film forming method for semiconductor device interconnection which overcomes the above-mentioned drawbacks of the prior art and which is suitable for mass-production, and an apparatus for carrying out the method.

In order to attain the above object, this invention provides an insulating film forming method for semiconductor device interconnection comprising: (i) a film forming step which comprises introducing an admixture of a film forming source gas for plasma CVD with an etching gas (reactive gas) comprising a fluorine-containing compound into a processing chamber of a plasma treatment system, to thereby generate a plasma; heating a substrate on a stage in the processing chamber so as to effect plasma CVD with the film forming source gas, thereby depositing an insulating film on an interconnection pattern of the substrate; and, simultaneously with the deposition of the film, directing gas ions of the fluorine atom containing gas in the reactive gas onto the insulating film by a potential difference developed between the plasma and the stage, so as to gasify a portion of the insulating film through a chemical reaction with the fluorine atom containing gas ions and to effect reactive etching, thereby forming an insulating film free of void on the interconnection pattern of the substrate; and (ii) a film planarization step which comprises cooling the substrate provided with the insulating film on the interconnection pattern; supplying a gas of a material being decomposable by the same reactive gas as used for etching of the insulating film and having a melting point higher than the temperature of the cooled substrate, into the processing chamber, so as to adsorb the gaseous material on the substrate; raising the temperature of the substrate to or above the melting point of the adsorbed material to convert the adsorbed material into a liquid, thereby planarizing the surface of the material; then lowering the temperature of the substrate to or below the melting point to solidify the adsorbed material; and subsequently performing reactive etching by use of the reactive gas and the plasma under such conditions as to equalize the etching rates of the solidified material film and the insulating film thereb-eneath, whereby the planeness of the surface of the solidified adsorbed material is printed on the surface of the insulating film. The adsorbed gas material can be said to serve as a sacrificing material for planarization by etchback.

When the film forming source gas for forming an insulating film by plasma CVD is admixed with the fluorine-containing etching gas and the plasma is generated to carry out the processing, the film formation from the film forming source gas proceeds with the accompanying reactive ion etching by the etching gas, whereby the film being formed is etched principally in the direction perpendicular to the substrate, and a film is formed in a tapered shape on side walls of the interconnection pattern. The film formed on the side surfaces of the pattern has a tapered shape broader at the top portion of an opening. Therefore, the growth of the film on the side surfaces of the pattern, on both sides of an opening, proceeds gradually from the bottom portion of the opening, so that no void is generated in the film thus formed.

In addition, the conversion of the gas material adsorbed on the surface of the substrate into a liquid renders the surface of the material planar, regardless of the surface shape of the substrate, and cooling the liquid material to or below the melting point thereof results in that the surface of the substrate is covered by a planar, solidified film of the material When etching is subsequently carried out under such conditions as to equalize the etching rates of the thus solidified film and the formed insulating film, the etching proceeds in accordance with the surface shape of the solidified film, irrespective of the rough surface shape of the insulating film, so that the insulating film surface becomes planar.

In the above-mentioned step (i), i.e. the film forming step, the insulating film is formed through deposition and, simultaneously, a portion of the insulating film thus formed is etched, with the etching rate controlled to within the range from 1/5 to 4/5 times the deposition rate. When the etching rate is below the range, void is produced in the insulating film obtained. When the etching rate is above the range, on the other hand, the combination of deposition and etching results in a lowered formation rate of the insulating film. Both of these cases, with the etching rate outside the above-mentioned range, thus lead to undesirable results. The control of the etching rate of the insulating film to within the range from 1/5 to 4/5 times the deposition rate can be achieved by regulating the flow rate of the etching gas introduced into the plasma treatment system to within the range from 1/20 to 4/5 times the flow rate of the film forming source gas, on a volume basis. Besides, the total gas pressure inside the plasma treatment system may be 0.1 to $10^3$ Pa, as usual.

The film formation rate can be controlled by regulating the ratio of the flow rate of the etching gas to the flow rate of the film forming source gas within the above-mentioned range. The film formation rate can be increased by reducing the flow rate of the etching gas, and can be lowered by increasing the etching gas flow rate. The film formation rate can be increased also by increasing the total gas flow rate, without varying the above-mentioned flow rate ratio. Variations in the deposition rate or etching rate of the insulating film with variations in other conditions, such as high-frequency power, are fundamentally the same as in the conventional plasma CVD or plasma etching.

In the above-mentioned step (ii), i.e. the film planarization step, it is generally preferable to set the pressure of the material gas introduced into the plasma treatment system in the range from 0.1 to $10^3$ Pa, in accordance with the etching gas pressure in the subsequent etch-pack step of 0.1 to $10^3$ Pa; however, a material gas pressure above the range may also be employed.

The equalization of the etching rate of the solidified adsorbed gas material (sacrificing material) to the etching rate of the insulating film therebeneath can be easily achieved by regulating the high-frequency power for the plasma treatment system, but other methods may also be employed for the equalization. In general, an increase in the high-frequency power results in that the etching rate of the adsorbed gas material and the etching rate of the insulating film are increased simultaneously, but with different gradients of increase. Ordinarily, the gradient of increase in etching rate, with increasing input power, is greater for the insulating film than for the adsorbed material film. This is illustrated by FIG. 5, in which line 101 represents the variation in the etching rate with varying input power, of the insulating film, and line 102 represents that of the solidified adsorbed gas material. As seen from FIG. 5, there is a high-frequency power value Peq at which the two etching rates are equal. It is therefore possible to achieve the film planarization, by adjusting the input power to Peq.

As mentioned above, this invention can be embodied most effectively by a combination of the film forming step of the invention with the film planarization step of the invention. However, a combination of the film forming step of this invention (the above-mentioned step (i)) with a conventional film planarization step or a combination of a conventional film forming step with the film planarization step of this invention (the above-mentioned step (ii)) can also be used, to give better results than those obtained by use of the conventional methods of forming an insulating film for interconnection. The conventional film planarization steps include, for example, a coating film method (SOG method), a sputter-etching method, an etchback method employing a resist film, etc., whereas the conventional film forming steps include, for example, a CVD method using a TEOS (Tetra Ethyl Ortho-Silicate) gas, etc.

DETAILED DESCRIPTION OF THE PREFERRED EMBODIMENTS

Some preferred embodiments of this invention will now be described below with reference to FIGS. 1, 2, 3 and 4.

EMBODIMENT 1

Figure 1:
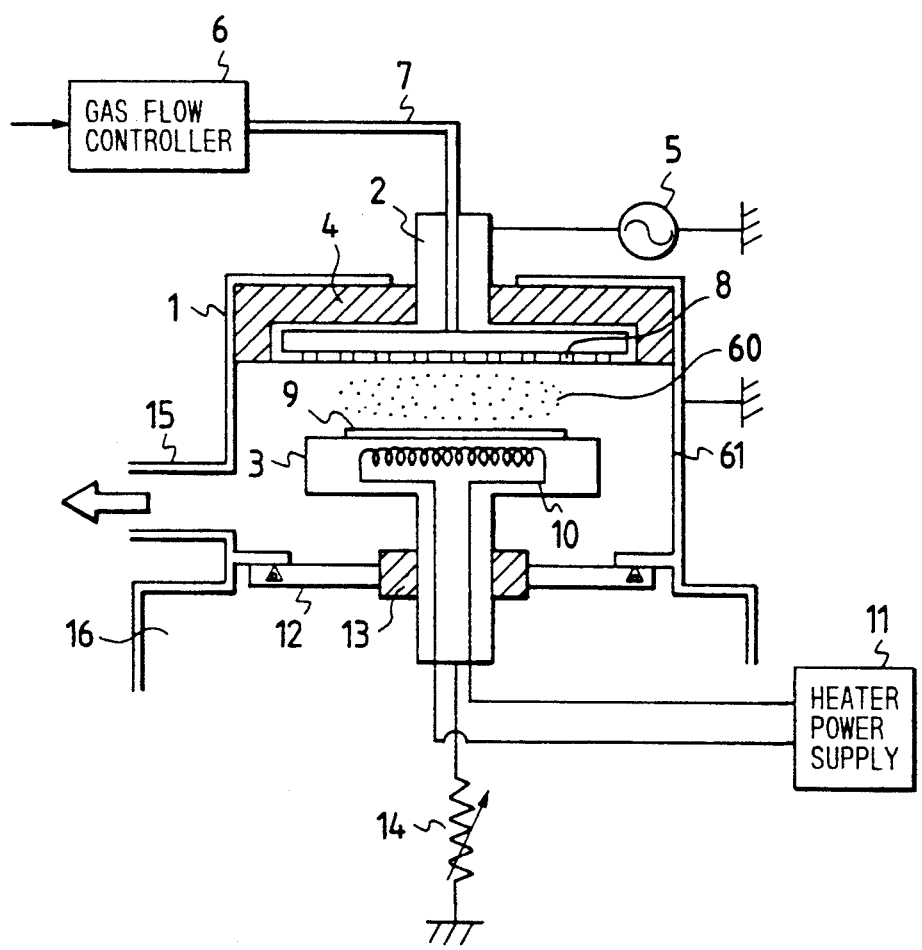
FIG. 1 is a schematic sectional view of an insulating film forming apparatus for semiconductor device interconnection, particularly for forming an insulating film, according to one embodiment of this invention.

FIG. 1 shows the construction of an apparatus for forming a void-free insulating film on a rough-surfaced interconnection pattern, particularly the construction of a processing chamber of the apparatus, which will be explained below.

The processing chamber 1 has an upper electrode 2 and a lower electrode 3 incorporated therein. The upper electrode 2 is insulated from the processing chamber 1 by a ceramic plate 4, and connected with an RF power supply 5 of a high frequency of 13.56 MHz. A gas flow controller 6 and a gas supply pipe 7 are provided so that an $Si(OC_2H_5)_4$ gas, an $O_2$ gas and a $CF_4$ gas can be supplied therethrough. The gas is supplied in a shower-like form into the processing chamber 1 through a small gas supply port 8 provided in the upper electrode 2. A semiconductor wafer 9 provided with an interconnection pattern on its surface is placed on the lower electrode 3. A heater 10 is incorporated in the lower electrode 3, and temperature is controlled by a heater power supply controller 11. The lower electrode 3 is insulated from a base 12 by an insulating block 13, thereby being insulated from the processing chamber 1, and is earthed through by a variable resistor 14.

An exhaust pipe 15 is connected to the processing chamber 1 so that the pressure inside the processing chamber 1 can be controlled to a preset value by an exhaust device, not shown.

On the lower side of the processing chamber 1 is provided a transferring chamber 16, in which a mechanism (not shown) is provided for driving the base 12 upward and downward.

With the base 12 pushed up, the base 12 and the processing chamber 1 are so engaged that the processing chamber 1 is hermetically sealed. The wafer 9 is transferred by a transferring mechanism (not shown) in the transferring chamber 16, in the condition where the base 12 is lowered.

For other aspects of the above-mentioned insulating film forming apparatus shown in FIG. 1, there can be used the conventional techniques of parallel plate plasma treatment system.

Now, the formation of an insulating film for interconnection by use of the apparatus shown in FIG. 1 will be explained with reference to FIGS. 1, 3a, 3b and 3c.

The wafer 9 is fed into the processing chamber 1, and the base 12 is pushed up to hermetically seal the processing chamber 1. The gas flow controller 6 is operated to mix the $Si(OC_2H_5)_4$, $O_2$ and $CF_4$ gases together and supply the mixed gas through the gas supply port 8 in a shower-like form. The wafer 9 is heated on the lower electrode 3 to a temperature of 300° to 400° C., the pressure inside the processing chamber 1 is controlled to a preset value, and a high-frequency voltage is impressed on the upper electrode 2 from the high-frequency power supply 5, thereby generating a plasma 60 in the processing chamber The flow rates of the $Si(OC_2H_5)_4$, $O_2$ and $CF_4$ gases were controlled to 100 cc/min, 0–800 cc/min and 20–400 cc/min, respectively, at 1 atm. Where the flow rate of the $O_2$ gas was zero, the flow rate of the $CF_4$ gas was controlled to 20 cc/min, whereas when the $O_2$ gas flow rate was high, the $CF_4$ flow rate was also made high. The total gas pressure inside the processing chamber 1 was regulated to 10 Pa. The high-frequency voltage applied was 100 to 500 V, with the frequency being 13.56 MHz. Generally, the frequency may be in the range from 400 kHz to 30 MHz.

The plasma 60 decomposes the $Si(OC_2H_5)_4$ gas, and the resulting silicon (Si) component reacts with the $O_2$ gas to form a silicon oxide film ($SiO_2$ film) 51 on an interconnection film 50 provided on the wafer 9 being heated by the heater 10. Simultaneously, the carbon (C) and hydrogen (H) arising from the decomposition are reaction with the $O_2$ gas. On the other hand, the $CF_4$ gas supplied in the mixed, shower-like form through the gas supply port 8 is decomposed, in the plasma 60, to $CF_3^+$ and F radicals. The applied high-frequency voltage generates a potential difference in a sheath between the upper electrode 2 and the plasma 60. Other potential differences due to the applied high-frequency voltage are also generated between the plasma 60 and the inner wall 61 of the processing chamber 1 and between the plasma 60 and the lower electrode 3.

Because the plasma treatment apparatus is of the anode coupling type in which the RF power supply 5 is connected to the upper electrode 2, as shown in FIG. 1, the potential difference generated between the upper electrode 2 and the plasma 60 is greater than the potential differences generated between the inner wall 61 of the processing chamber 1 and the plasma 60 and between the lower electrode 3 and the plasma 60. The $CF_3^+$ ions are accelerated by the potential difference between the sheaths, and are directed onto the electrode 3 or the wafer 9. The silicon oxide film ($SiO_2$ film) 51 formed on the wafer 9 reacts with the $CF_3^+$ ions directed thereto with acceleration, forming an $SiF_4$ gas and a $CO_2$ gas, which are exhausted through the exhaust pipe 15. Thus, etching proceeds.

In this case, the $CF_3^+$ ions are accelerated and so directed as to be perpendicularly incident on the wafer 9. Therefore, even portions and overhanging portions of the silicon oxide film ($SiO_2$ film) 51 are etched predominantly, without progressive etching of side surfaces of stepped portions of the film 51. In addition, a sputtering effect of the $CF_3^+$ ions causes a preferential etching of film surfaces lying at an angle of about 45° relative to the perpendicular direction, whereby the progress of etching is assisted. The deposition rate of the oxide silicon film was about 600 nm/min, and the etching rate was 300 to 400 nm/min.

Figure 3A:
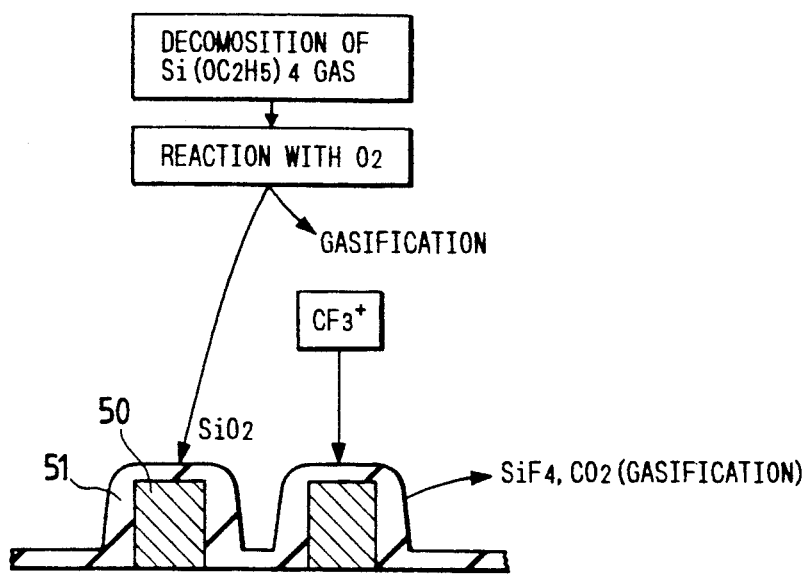
FIGS. 3a, 3b and 3c are sectional views illustrating an insulating film forming process by use of the apparatus shown in FIG. 1.
Figure 3B:
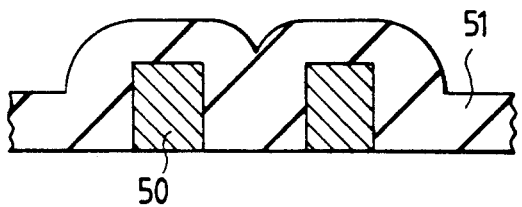
Figure 3C:
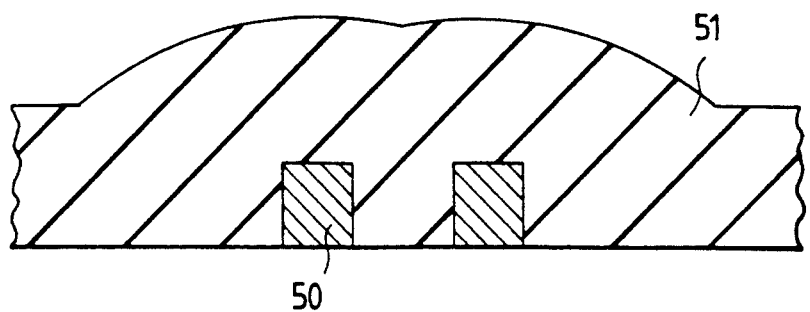

In this manner, the silicon oxide film ($SiO_2$ film) 51 is formed by the reactions between the decomposed gases of the $Si(OC_2H_5)_4$ gas and the $O_2$ gas, while the overhanging portions and the slant surfaces with an inclination angle of about 45°, of the silicon oxide film thus formed, are preferentially etched As a result, the silicon oxide film 51 thus obtained has a tapered shape as shown in FIG. 3a, with no void formation in the silicon oxide film 51. In other words, this silicon oxide film forming process is free of the possibility that a film may be deposited in an overhanging form on the upper side of the interconnection film 50 and the overhanging portions on both sides may make contact with each other to form void in the deposited film. Therefore, a silicon oxide film free of voids can be formed, as shown in FIG. 3b, by the process. The processing is further continued in the processing chamber 1 to form the silicon oxide film until the shape shown in FIG. 3c is obtained, upon which the processing is completed.

In this method, the conventional etching of a silicon oxide film by sputter-etching with $Ar^+$ ions is not employed but, instead, a portion of the silicon oxide film is gasified by chemical reactions and exhausted. Therefore, deposition of sputtered silicon oxide films on the inner wall 61 of the processing chamber 1 or the like with the resultant formation of dust can be prevented, and the silicon oxide film 51 of high quality can be formed on the interconnection film 50.

Besides, $Si(OCH_3)_4$, $SiF_4$ and $SiH_4$ gases and the like, other than the gas used in the above embodiment, can also be used as the film forming source gas.

Further, the etching gas may be any fluorine-containing gas, such as $C_4F_8$, $C_3F_8$ and $CHF_3$.

In this embodiment, the potential difference between the upper electrode 2 and the plasma 60 is greater than the potential differences between the inner wall 61 of the processing chamber 1 and the plasma 60 and between 10 the lower electrode 3 and the plasma 60, as has been described above. Because the rate of etching of the silicon oxide film 51 by the $CF_3^+$ ions is proportional to this accelerating voltage, the etching rate of the film on the surface of the upper electrode 2 in this embodiment is higher than the etching rate of the film on the surface of the wafer 9, and is 600 to 800 nm/min. The deposition rate of the silicon oxide film 51 on the upper electrode 2 and the deposition rate of the film 51 on the lower electrode 3 are equal. It is therefore possible to form the silicon oxide film 51 only on the wafer without deposition of the film on the upper electrode 2, by controlling the etching rate of the film on the upper electrode 2 to a value equal to or higher than the deposition rate of the film on the upper electrode 2. Accordingly, it is possible to prevent the generation of dust arising from exfoliation of a deposited film on the upper electrode 2, and to realize formation of a silicon oxide film of high quality.

Furthermore, when the impedance to a high-frequency current flowing through the lower electrode 3 is raised by the variable resistor 14 to reduce the high-frequency current flowing through the lower electrode 3, as in this embodiment, the potential difference between the lower electrode 3 and the plasma 60 is also reduced. As a result, the accelerations of the $CF_3^+$ ions toward the upper electrode 2, the inner wall 61 of the processing chamber 1, and the lower electrode 3 are in the relationship: (acceleration toward the upper electrode 2) (acceleration toward the inner wall 61)>(acceleration toward the lower electrode 3), and the etching rates of the films on these members are in a relationship proportional to the above relationship. Accordingly, by controlling the etching rate of the silicon oxide film on the inner wall 61 of the processing chamber 1 to a value higher than the deposition rate of the film on the inner wall 61, it is possible to form the silicon oxide film only on the lower electrode 3 while preventing the formation of the film on the other portions inside the processing chamber 1.

Besides, the resistance range of the variable resistor 14 was from about 20 to about 300Ω, in view of the resistance between the electrodes in generation of the plasma being about 100 to about 200Ω.

As described above, this method as shown in FIG. 1 is free of film formation on the inner wall 61 of the processing chamber 1 during the film forming process. Therefore, there is no need for removal, after the film forming process, of films deposited in the interior of the processing chamber 1, so that an enhanced throughput can be obtained. In addition, the simultaneous reactive ion etching and film formation enables a lowering in the energy of the ions, such as $CF_3^+$, necessary for etching, and produces a smaller effect on the semiconductor devices formed on the wafer 9, as compared with the case where sputter-etching (physical etching treatment) is carried out simultaneously. Although the $CF_4$ gas for etching and the $Si(OC_2H_5)_4$ and $O_2$ gases for film formation have been supplied in a mixed state to carry out both the etching operation and the film forming operation simultaneously in the above embodiment as shown in FIG. 1, it has been experimentally confirmed that these operations can be carried out separately, without causing any problems. That is, the etching and the film formation can be carried out by first supplying the $Si(OC_2H_5)_4$ and $O_2$ gases to deposit the silicon oxide film and then switching the supplied gas to the $CF_4$ so as to carry out the etching before generation of void in the deposited film occurs. Moreover, the method of lowering the etching rate of the film on the wafer 9 is not limited to the method using the variable resistor 14 illustrated in this embodiment but may be any method by which the etching rates of the films on the upper electrode 4, the lower electrode 3 and the inner wall 61 of the processing chamber 1 can be controlled, for example, a method wherein a power supply (not shown) of a frequency different from that of the high-frequency power supply 5 is connected to the lower electrode 3 and the outputs of the two power supplies are controlled.

EMBODIMENT 2

Apparatus and method for planarization of the surface of the silicon oxide film 51 formed as above will now be explained below.

Figure 2:
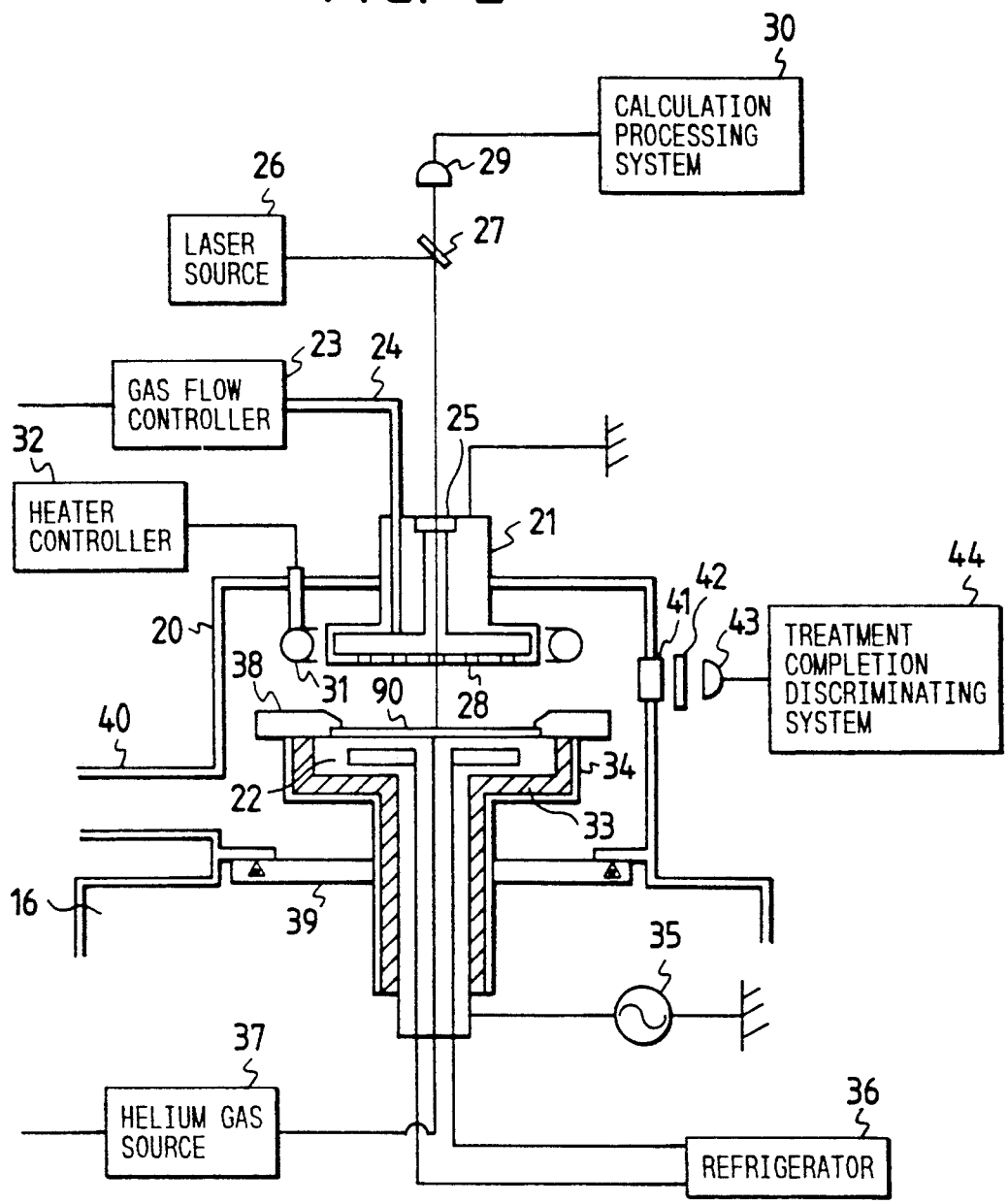
FIG. 2 is a schematic sectional view of an insulating film forming apparatus for semiconductor device interconnection, particularly for planarizing an insulating film, according to another embodiment of this invention.

In FIG. 2, there is shown the construction of an apparatus for planarizing the surface of an insulating film formed on an interconnection pattern, particularly the construction of a processing chamber of the apparatus, which will be explained below.

The processing chamber 20 has an upper electrode 21 and a lower electrode 22 incorporated therein. An Si(OCH$_3$)$_4$ gas and a $CF_4$ gas can be supplied to the upper electrode 21 through a gas flow controller 23 and a gas supply pipe 24. The upper electrode 21 is provided with an opening in a central portion thereof, and the opening is vacuum sealed by a quartz plate 25 placed thereon. A laser source 26 incorporates a laser system capable of emitting laser light, at two or more wavelengths. The laser light emitted from the laser system is reflected by a half-mirror 27 and passes through the quartz plate 25 and a gas supply port 28, to be incident on a semiconductor wafer 90 provided thereon with an interconnection pattern and an insulating film covering the interconnection pattern. The light reflected from the wafer 90 returns along the same path as above and then through the half-mirror 27, to be incident on a detector 29.

The detector 29 is so designed that the intensity of the reflected light can be measured for each of the wavelengths of the laser source, and the thickness of the insulating film formed on the wafer 90 can be calculated by a calculation processing system 30. A lamp heater 31 is disposed around the upper electrode 21, and is controlled by a heater controller 32, whereby the temperature of the wafer 90 can be raised by 40° C. The wafer 90 is placed on the lower electrode 22. An earth shield 34 is connected to the periphery of the lower electrode 22 through a ceramic part 33, so that electric discharge occurs only on the upper surface of the lower electrode 22 when a high-frequency voltage is applied to the lower electrode 22 from a power supply 35 of a high frequency of 13.56 MHz. A coolant cooled to a temperature of −60° to −70° C. can be supplied from a refrigerator 36 into the lower electrode 22, thereby cooling the electrode 22 to a temperature of −60° C. Also, a helium gas source 37 is provided for passing a helium gas between the wafer 90 and the electrode 22 at a fixed flow rate. A wafer clamp 38 is disposed around the wafer 90 so as to press the wafer 90 against the electrode 22.

On the lower side of the processing chamber 20 is provided a transferring chamber 16, which is provided with a mechanism (not shown) for driving a base 39 upward and downward.

With the base 39 pushed up, the base 39 and the processing chamber 20 engage with each other so that the processing chamber 20 is hermetically sealed. The wafer 90 is transferred by a transferring mechanism (not shown) in the transferring chamber 16, in the condition where the base 39 is lowered.

The processing chamber 20 is provided further with an exhaust pipe 40 and a monitoring window 41. An exhaust device, not shown, is connected to the exhaust pipe 40 so that the pressure inside the processing chamber 20 can be controlled to a set value. A detector 43 is provided facing the monitoring window 41, with a filter 42 therebetween, so that variations in the luminescent levels of hydrogen-containing molecules and hydrogen atoms in the plasma can be measured When a signal from the detector 43 is lowered below a preset level, a treatment completion discriminating system 44 judges the treatment as completed.

Of the above-mentioned insulating film forming apparatus for planarizing an insulating film, as shown in FIG. 2, the other aspects than those described herein may be set according to the conventional techniques of parallel plate plasma treatment system.

Now, planarizaton of an insulating film by use of the above apparatus shown in FIG. 2 will be explained below with principal reference to FIGS. 2, 4a, 4b, 4c and 4d.

A wafer 90, which has been processed completely in the processing chamber 1 in Embodiment 1 above, is transferred onto the lower electrode 22 of the apparatus shown in FIG. 2.

The base 39 is pushed up to hermetically seal the processing chamber 20, and the wafer 90 is clamped onto the lower electrode 22 by the wafer clamp 38. Laser light with two or more wavelengths is emitted from the laser source 26, and the thickness of the silicon oxide film ($SiO_2$ film) 51 formed in an area provided in the wafer 90 for measurement of the film thickness is calculated from the intensity ratio of the reflected laser light of each wavelength, as known in the art. The intensity of the reflected laser light varies periodically in a fixed relationship with film thickness, because of the interference between the light which is reflected by the surface of the silicon oxide film 51 and the light which is reflected by the interface of the silicon oxide film 5 and the interconnection film 50 therebeneath. It is known that the period of the variation depends on the wavelength of light, and use of a larger number of wavelengths enables the film thickness measurement to be achieved with higher accuracy The thickness of the silicon oxide film 51 formed is measured by the above method.

The lower electrode 22 is cooled to a temperature of $-60°$ C., so that when the helium gas is permitted to flow between the wafer 90 and the lower electrode 22, the rate of heat transfer between the wafer 90 and the electrode 22 is enhanced, and the wafer 90 is cooled to $-40°$ C. The flow rate of the helium gas was about 1 cc/min.

An $Si(OCH_3)_4$ gas is supplied through the gas flow controller 23 to maintain the pressure inside the processing chamber 20 at or below $10^3$ Pa, which is the vapor pressure of the $Si(OCH_3)_4$ at $20°$ C.

Because the surface temperatures of the processing chamber 20 and the upper electrode 21 are maintained at a room temperature of $20°$ C. or above, condensation of the $Si(OCH_3)_4$ gas does not occur on these members. On the other hand, the surface of the wafer 90 is cooled to $-40°$ C. and, therefore, the $Si(OCH_3)_4$ gas is deposited as a solid on the surface of the wafer 90. The amount of the material deposited can be calculated from the variation in the intensity of the reflected laser light due to interference, which is detected by the detector 29. However, continuous emission of the laser produces a rise in the surface temperature of the wafer; therefore, the measurement of the deposition amount is carried out by intermittently emitting the laser light.

When the preset film thickness is reached, the supply of the $Si(OCH_3)_4$ gas is stopped by the gas flow controller 23. In this embodiment, the thickness of the Si-($OCH_3)_4$ film was 2 to 3 $\mu$m. The film thickness of the sacrificing material is generally 2 to 3 times the height of the interconnection layer lying therebeneath, but may vary depending on the line spacing of interconnection pattern.

Figure 4A:
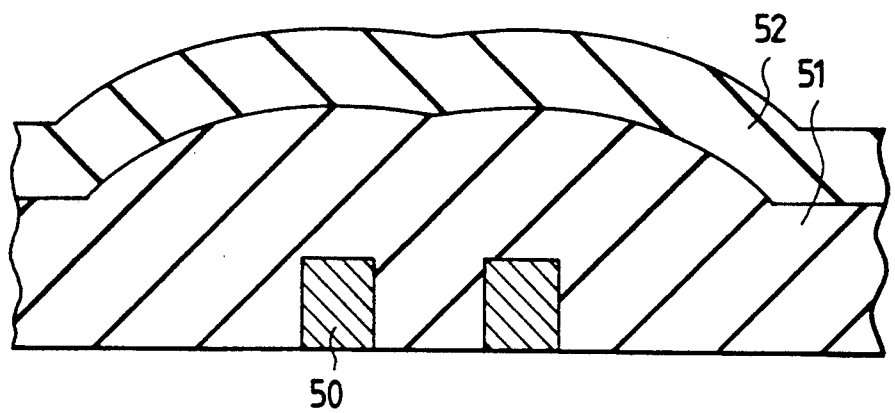
FIGS. 4a, 4b, 4c and 4d are sectional views illustrating an insulating film planarizing process by use of the apparatus shown in FIG. 2.
Figure 4B:
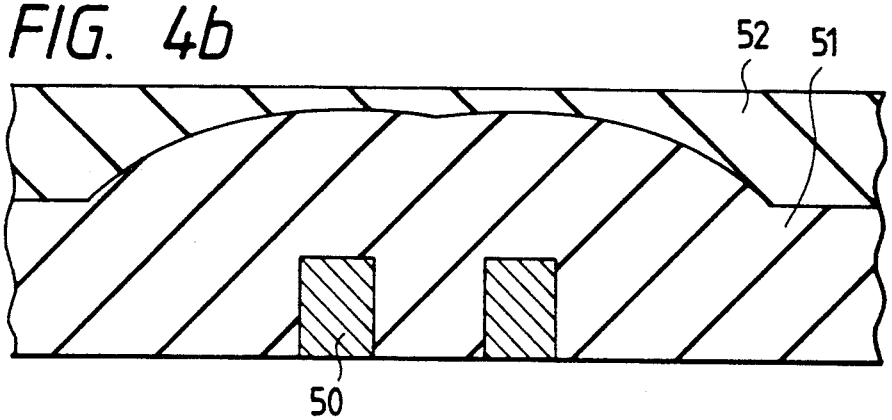

After the completion of the above processing, the adsorbed $Si(OCH_3)_4$ film 52 is adhered to the surface of the wafer 90, as shown in FIG. 4a. The lamp heater 31, which is a radiation heating means, is turned on to raise the wafer temperature to $0°$ C. Naturally, the lower electrode 22 may be provided with means for measuring the wafer temperature. The $Si(OCH_3)_4$, having a melting point of $-4°$ C., is liquefied by the heating, and the surface thereof becomes planar, as shown in FIG. 4b. Thereafter, the lamp heater 31 is turned off, and the temperature of the wafer 90 is again lowered to $-40°$ C., whereby the liquefied $Si(OCH_3)_4$ is converted again into a solid.

Figure 4C:
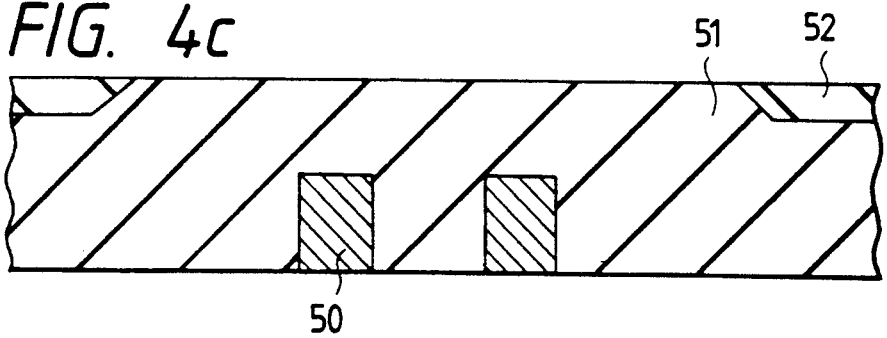
Figure 4D:
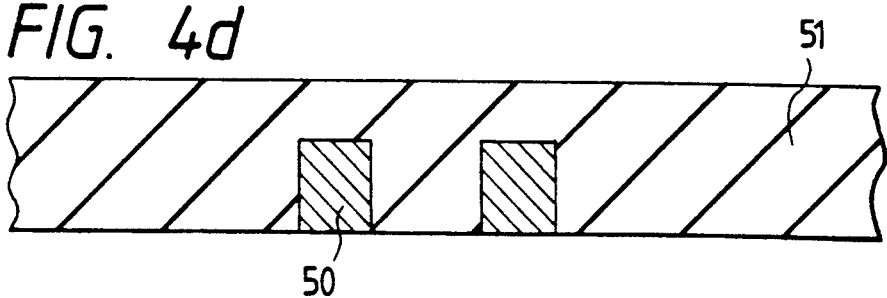
Figure 5:
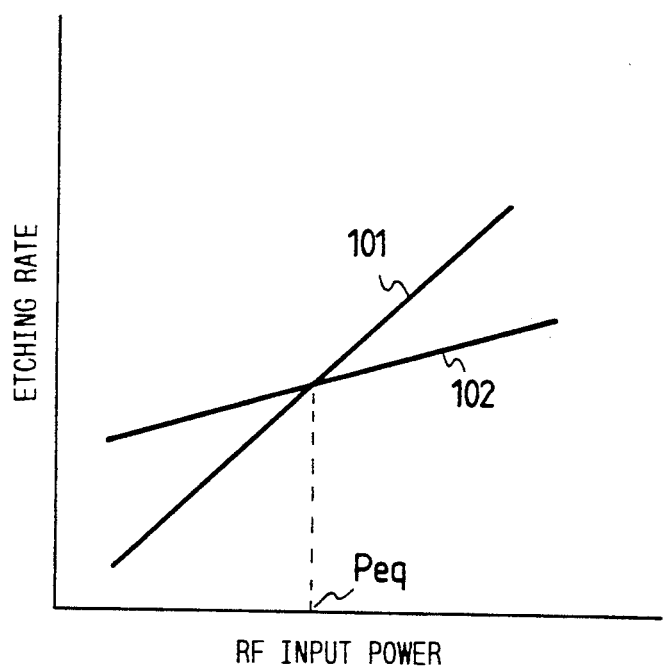
FIG. 5 is a graph showing the relationship between a high-frequency (RF) power input to a plasma treatment system and the etching rate in plasma etching.

Next, a $CF_4$ gas is supplied through the gas supply pipe 24, and a high-frequency voltage is impressed on the lower electrode 22 by the 13.56 MHz high-frequency power supply 35, thereby producing electric discharge between the lower electrode 22 and the upper electrode 21. The frequency of the high-frequency power may generally be 400 kHz to 30 MHz. The $CF_4$ gas is decomposed by the plasma into $CF_3^+$, F radicals, etc., and these ions and radicals cause the decomposition of the $Si(OCH_3)_4$ film 52 into gaseous components, such as SiF, CO, CH and H, and the attendant progress of etching. The high-frequency power, the processing pressure and the like are adjusted by the high-frequency power supply 35, a controlling means connected to the exhaust pipe 40 and the like, respectively, so as to provide conditions under which the etching rates of the solidified $Si(OCH_3)_4$ film 52 and the silicon oxide film 51 are equal. When etching is carried out under such conditions, the surface of the insulating film (silicon oxide film) 51 on the wafer 9 is etched to acquire and then maintain a planar surface shape, as shown in FIG. 4c. While the $Si(OCH_3)_4$ is remaining, emission of light from H-containing molecules or atoms, such as CH, H and OH, exists in the plasma. By analyzing the variations in the spectral intensity of the emission from plasma by a spectral analyzer, it is possible to verify whether the $Si(OCH_3)_4$ film 52 is present or absent. When complete removal of the $Si(OCH_3)_4$ film 52 is detected by the treatment completion discriminating system 44, the etching treatment is completed. Upon this, the surface of the silicon oxide film 51 appears as shown in FIG. 4d. Where the thickness of the silicon oxide film 51, as measured through the laser interference detected by the detector 29 before the etching treatment, is greater than the preset value, the etching treatment is not stopped immediately upon the complete removal of the $Si(OCH_3)_4$ film 52 but is continued until the excess thickness is removed, thereby completing the treatment.

In the manner as above, the surface of the insulating film can be planarized, regardless of the rough shape of the surface of the wafer 9 (the rough shape of the original surface of the insulating film) due to the presence of the interconnection film 50.

Incidentally, processes for formation of a silicon oxide film by adsorbing TEOS (Tetra Ethyl Ortho-Silicate, $Si(OC_2H_5)_4$) on a cooled substrate and oxidizing the adsorbed $Si(OC_2H_5)_4$ are disclosed in "Very Large Scale Integration Process Data Handbook", 1990, March, (published from K.K. Science Forum), pp. 351-356 and in A Collection of Papers for the 1st "Symposium on CVD Techniques for Very Large Scale Integration" (1988, March), pp. 26-30, but the processes are quite different from the method of this invention with respect to other aspects than the above-mentioned.

Although this invention has been described above with reference to the use of $Si(OCH_3)_4$ as a gas to be deposited, the gas to be deposited is not limited to the $Si(OCH_3)_4$ For example, $Si(OC_2H_5)_4$ with a melting temperature of $-77°$ C. can also be used if it is possible to lower the electrode temperature to about $-100°$ C. It is apparent that this invention is applicable to any of those materials which can be supplied as a gas, have a melting point in the control range of wafer temperature, and which can be etched by the same gas as that capable of etching the insulating film 52 and at an etching rate equal to the etching rate of the insulating film 52. Although the above description of this invention has been made with reference to melting the deposited Si(OCH$_3$)$_4$ through heating the wafer by the lamp heater, the melting method is not limited to the above-mentioned but may be any method by which the wafer temperature can be controlled, such as control of the temperature of the lower electrode.

Gases of C$_4$F$_8$, C$_3$F$_8$, CHF$_3$ and the like, other than CF$_4$, can also be used as the etching gas.

Besides, although this invention has been described above as having the processing chamber 1 and the processing chamber 20 connected to each other by the same transferring system, the two processing chambers may be independent systems which are not connected by the same transferring system.

According to this invention, it is possible to form a planar insulating film, free of void, on an interconnection pattern, thereby enabling the manufacture of highly integrated devices of multilevel interconnection structure in high yield. Because this invention does not employ sputter-etching or the like treatment which requires ions of high energy, it is also possible by the invention to form a planar insulating film without affecting the characteristics of highly integrated, finely patterned devices, and to enable the manufacture of semiconductor devices in high yield.

Since the wafer temperature in this invention is not raised to or above 400° C., furthermore, little influence is exerted on the impurity concentration profile of devices, so that it is possible to fabricate finely structured semiconductor devices in good yield.

Moreover, this invention does not involve a wet processing such as coating, and therefore enables a continuous vacuum processing in a continuous system, thereby promising simplified processing steps.

We claim:

1. An insulating film forming method for semiconductor device interconnection which comprises the steps of:
    (a) placing a substrate provided with an interconnection on a stage disposed in a processing chamber of a plasma treatment system;
    (b) introducing an admixture of a film forming gas for plasma CVD with a reactive gas comprising a fluorine-containing compound into the processing chamber, to thereby generate a plasma;
    (c) heating the substrate on the stage so as to effect plasma CVD with the film forming gas, thereby depositing an insulating film on the interconnection pattern of the substrate; and
    (d) simultaneously with the deposition of the insulating film onto the substrate by plasma CVD, etching the insulating film with ions of the fluorine compound in the reactive gas to accelerate and direct the ions onto the insulating film by a potential different developed between the plasma and the stage, whereby the insulating film being formed is etched principally in a direction perpendicular to the substrate, and the insulating film is formed in a tapered shape on side walls of the interconnection pattern so as to form the insulating film free of void on the interconnection pattern of the substrate.

2. The method as set forth in claim 1, wherein the deposition rate of the insulating film onto the substrate is controlled to be higher than the deposition rates on the other portions inside the processing chamber, so as to prevent the deposition of the insulating film on inner walls of the processing chamber.

3. The method as set forth in claim 1, wherein the impedance to a current flowing through the substrate is made to be higher than the impedances to currents flowing through the other portions inside the processing chamber, so as to lower the reactive etching rate and prevent the deposition of the insulating film on inner walls of the processing chamber.

4. The method as set forth in claim 1, wherein a high-frequency voltage is impressed on an electrode disposed in the processing chamber at a position opposite to the stage, and a mixture of the film forming gas with the reactive gas is supplied from the area of the electrode to a region over the substrate, so as to generate the plasma.

5. The method as set forth in claim 1, wherein the insulating film is a silicon oxide film.

6. The method as set forth in claim 5, wherein the film forming gas comprises at least one selected from Si(OC$_2$H$_5$)$_4$, Si(OCH$_3$)$_4$, SiF$_4$ and SiH$_4$, together with an oxygen gas.

7. The method as set forth in claim 5, wherein the reactive gas comprises at least one selected from CF$_4$, C$_4$F$_8$, C$_3$F$_8$ and CHF$_3$.

8. An insulating film forming method for semiconductor device interconnection which comprises the steps of:
    (a) placing a substrate having an interconnection pattern provided with an insulating film thereon, on a stage disposed in a processing chamber of a plasma treatment system;
    (b) supplying a material decomposable by the same reactive gas as used for etching of the insulating film, onto the substrate in the processing chamber in a gaseous state, so as to deposit the gaseous material as a solid film with a predetermined thickness on the surface of the insulating film on the substrate;
    (c) raising the temperature of the thus deposited film to convert the deposited film into a liquid film, thereby planarizing the surface of the film;
    (d) then lowering the temperature of the liquid film to solidify the film; and
    (e) subsequently supplying the reactive gas to a region over the substrate so as to generate a plasma and to effect plasma etching of the surface of the insulating film together with the solidified film, thereby planarizing the surface of the insulating film.

9. The method as set forth in claim 8, wherein the insulating film is a silicon oxide film.

10. The method as set forth in claim 9, wherein the material gas comprises either of Si(OCH$_3$)$_4$ and Si(OC$_2$H$_5$)$_4$.

11. The method as set forth in claim 9, wherein the reactive gas comprises at least one selected from CF$_4$, C$_4$F$_8$, C$_3$F$_8$ and CHF$_3$.

12. The method as set forth in claim 8, wherein the deposition of the film of the gaseous material and the solidification of the liquid film are carried out by cooling the substrate to or below the melting point of the material.

13. The method as set forth in claim 8, wherein the liquefaction of the deposited film is carried out by heating from above the substrate by use of a heater.

14. An insulating film forming method for semiconductor device interconnection comprising:

(a) an insulating film forming step which comprises placing a substrate, provided with an interconnection pattern, on a stage disposed in a processing chamber of a plasma treatment system; introducing an admixture of a film forming gas for plasma CVD with a reactive gas comprising a fluorine-containing compound into the processing chamber, to thereby generate a plasma; heating the substrate on the stage so as to effect plasma CVD with the film forming gas, thereby depositing an insulating film on the interconnection patter of the substrate; and simultaneously with the deposition of the film, accelerating and directing gas ions of the fluorine compound in the reactive gas onto the insulating film by a potential different developed between the plasma and the stage, so as to effect reactive etching to form the insulating film in a tapered shape on side walls of the interconnection pattern during the film deposition on the side walls thereof, thereby forming an insulating film free of void on the interconnection pattern of the substrate; and (b) an insulating film surface planarizing step which comprises placing a substrate having an interconnection pattern provided with an insulating film thereon, on a stage disposed in a processing chamber of a plasma treatment system; supplying a material decomposable by the same reactive gas as used for etching of the insulating film, onto the substrate in the processing chamber in a gaseous state, so as to deposit the gaseous material as a solid film with a predetermined thickness on the surface of the insulating film on the substrate; raising the temperature of the thus deposited film to convert the deposited film into a liquid film, thereby planarizing the surface of the film; then lowering the temperature of the liquid film to solidify the film; and subsequently supplying the reactive gas to a region over the substrate so as to generate a plasma and to effect plasma etching of the surface of the insulating film together with the solidified film, thereby planarizing the surface of the insulating film.

* * * * *